United States Patent [19]

Mols et al.

[11] Patent Number: 5,359,613
[45] Date of Patent: Oct. 25, 1994

[54] TUNABLE LASER OSCILLATOR

[75] Inventors: Petrus P. G. Mols; Pieter W. Hooijmans; Markus T. Tomesen, all of Eindhoven, Netherlands

[73] Assignee: U.S. Philips Corporation, New York, N.Y.

[21] Appl. No.: 936,149

[22] Filed: Aug. 26, 1992

[30] Foreign Application Priority Data

Aug. 30, 1991 [EP] European Pat. Off. ........ 91202204.3

[51] Int. Cl.⁵ ............................................. H01S 3/10
[52] U.S. Cl. ..................................... 372/20; 372/50; 372/96
[58] Field of Search ............................. 372/20, 50, 96

[56] References Cited

U.S. PATENT DOCUMENTS

| | | | |
|---|---|---|---|
| 4,914,666 | 4/1990 | Glance | 372/20 |
| 4,920,542 | 4/1990 | Brosson et al. | 372/20 |

OTHER PUBLICATIONS

"Einfugrun In Die Numerische mathematik I" By Josef Stoer, Springer Verlag, ISBN 0-387-05750-1, Chapter 5. (No English Language Translation) (no Date).

*Primary Examiner*—James W. Davie
*Attorney, Agent, or Firm*—Richard A. Weiss

[57] ABSTRACT

A laser oscillator having a laser which produces a laser output signal tuned to a desired frequency as a result of at least two tuning (i.e., frequency control) signals applied to inputs thereof from a control unit. The control unit receives a frequency difference signal which is a measure of the difference between the laser output signal and a reference signal, and uses that frequency difference signal together with present values to derive the tuning signals. The control unit stores a variety of different values for the preset values so that the laser output signal can be tuned to a variety of different desired frequencies. To avoid undesired frequency jumps of the laser output signal due to mode hopping, the control unit assures that the tuning signal will have a predetermined disproportional relationship. The control unit is able to correct the preset values (and the values used therefor) on the basis of the frequency difference signal.

15 Claims, 4 Drawing Sheets

TUNABLE LASER OSCILLATOR

BACKGROUND OF THE INVENTION

The invention relates to a tunable laser oscillator comprising a laser for producing an output signal, and a control unit for applying a first tuning signal to a first control input of the laser for tuning the laser to a desired frequency.

A laser oscillator of this type is known from U.S. Pat. No. 4,914,666. Such laser oscillators are used, for example, in transmitters or receivers for coherent optical transmission systems.

To transport a baseband signal via a glass fibre in coherent optical transmission systems, a light signal coming from a transmitting laser can be amplitude, frequency or phase modulated by the baseband signal before the light signal is fed to the glass fibre.

To demodulate the light signal at a receiver with the aid of current electronic components, it is necessary to convert the light signal, which has a very high frequency (for example, $10^{14}$ Hz), to a much lower intermediate frequency of, for example, $10^9$ Hz. For this purpose, the received light signal is combined in the receiver with a local laser-generated light signal with the aid of a photodiode. This combination provides an intermediate frequency signal which has a frequency equal to the difference frequency between the frequency of the received light signal and that of the locally generated light signal.

To simultaneously transport more than a single light signal via a glass fibre, lasers which are tunable over a large frequency range (for example, 500 GHz) are used in both the transmitter and the receiver. As a result, more transmitters and receivers can communicate via the same glass fibre without causing interference with one another.

The frequency of the light signal generated by a tunable laser depends, for example, on the value of one or more electrical signals which are applied to one or more control inputs of the laser. In prior-art laser oscillators, a laser which has two control inputs is used. The same tuning signal, generated by the control unit, is applied to these control inputs through two resistors. The relation between a desired frequency and the associated tuning signal is determined in the control unit. This relation may be determined by means of a single measurement of the frequency of the light generated by the laser as a function of the tuning signal. The control signal may be, for example, a current flowing through an active part of the laser, or one which determines, for example, the temperature or another ambient condition of the laser.

During the tuning operation in prior-art laser oscillators, the frequency of the light signal generated by the laser may change in a jumpy fashion which causes hysteresis, i.e., when the tuning signal is increased slowly, a frequency jump occurs at a value different from when the tuning signal is reduced. This is undesired because the relation between the tuning signal and the wavelength of the light signal generated by the laser is ambiguously fixed, i.e., two different frequencies may belong to a single value of the tuning signal.

SUMMARY OF THE INVENTION

It is an object of the invention to provide a tunable laser oscillator of the type mentioned in the opening paragraph in which the occurrence of frequency jumps of the laser during the tuning process is avoided.

For this purpose, the invention is characterized in that the control unit is arranged for applying at least one additional tuning signal to one additional control input of the laser for tuning the laser to the desired frequency while a disproportional relation between the tuning signals is stored in the control unit.

The invention is based on the recognition that frequency jumps are caused because lasers change to a different oscillation mode when a tuning signal has specific values. It appears that there needs to be a certain disproportional relation between the two tuning (i.e., frequency control) signals in order to avoid frequency jumps. By giving, in accordance with the inventive idea, the two tuning signals a disproportional relation, the occurrence of frequency jumps during laser tuning may be avoided.

It is conceivable that for other types of laser oscillators a disproportional relation between two or more tuning signals is necessary for other reasons (for example, for minimizing the spectral line width). This problem may also then be solved by implementing the measures according to the inventive idea.

If the intermediate frequency of a receiver is, for example, 1 GHz, the tuning accuracy of both the laser oscillator in the transmitter and the laser oscillator in the receiver is better than 0.1% with a tuning range of 500 GHz. To safeguard this tuning accuracy of a laser oscillator, a frequency comparing unit in a prior-art laser oscillator generates a difference signal which is a measure of the frequency difference between the frequency of the light signal generated by the laser and a reference frequency. In order to reduce the frequency difference, the difference signal is simply added to the tuning signal in the prior-art laser oscillator. As a result, it continues to be possible for boundaries between ranges covering different modes of oscillation to be transgressed. In order to avoid this, an embodiment of the invention is characterized in that the laser oscillator comprises a frequency comparing unit for supplying the control unit with a frequency difference signal which is a measure of the difference between the frequency of the laser output signal and a reference frequency, and the control unit comprises an adapting unit for adapting at least one of the tuning signals to reduce the frequency difference.

By adapting one or more tuning signals in the event of a frequency difference between the frequency of the light signal generated by the laser and a reference frequency, it may be guaranteed that when the tuning signal is adapted, the aforementioned disproportional relation between the tuning signals is maintained so that boundaries between ranges which denote different oscillation modes will not be transgressed.

Another embodiment of the invention is characterized in that the adapting unit comprises a combining element for combining to derive a tuning signal the frequency difference signal with a preset value of that relevant tuning signal stored in a memory. By realizing the adaptation of the tuning signal(s) by way of combining the difference signal with the preset value(s) stored in the control unit, a control loop is obtained which reduces the frequency difference to substantially zero while at the same time the tuning signal(s) avoid(s) transgressing boundaries between ranges which denote different oscillation modes.

A further embodiment of the invention is characterized in that the adapting unit comprises a correction unit for correcting the preset value of at least a tuning signal stored in the memory in response to the frequency difference signal. This makes it possible to keep the initial frequency difference small when a desired frequency is tuned to in the case where the laser is subjected to an ageing process. Consequently, if more than one reference frequency is supplied, the change of a faulty reference frequency being tuned to is reduced. The manner in which this preset value may be adapted is described hereinafter.

Assuming that the laser is controlled by N tuning signals, the frequency of the light signal generated by the laser may be written as:

$$f = f(I_1, I_2, \ldots I_{N-1}, I_N) \quad \text{Eq. (1)}$$

The desired disproportional relation between the different tuning signals, to be termed tuning curve hereinafter, may be defined on the basis of $N-1$ functions of one of the tuning signals:

$$\begin{aligned} I_2 &= g_2(I_1) \\ I_3 &= g_3(I_1) \\ &\vdots \\ I_{N-1} &= g_{N-1}(I_1) \\ I_N &= g_N(I_1) \end{aligned} \quad \text{Eq. (2)}$$

If for a certain preset value j of the signals $I_1$ to $I_N$ the control loop generates correction signals $\Delta I_1^m(j)$ the new present value $I_1, I_2, \ldots I_{N-1}, I_N$ is to satisfy:

$$\begin{aligned} f(I_1(j), I_2(j), \ldots, I_{N-1}(j), I_N(j)) &= f(I_1(j) + \Delta I_1^m(j), \ldots I_N + \Delta I_N^m(j)) \\ I_2 &= g_2(I_1) \\ I_3 &= g_3(I_1) \\ &\vdots \\ I_{N-1} &= g_{N-1}(I_1) \\ I_N &= g_N(I_1) \end{aligned} \quad \text{Eq. (3)}$$

Eq. (3) forms the system of N comparisons with N unknowns, so that the new preset value may be derived from Eq. (3). Since the functions f and g will generally be non-linear, the solution to Eq. (3) is usually to be determined numerically.

A further embodiment of the invention is characterized in that for a finite number of desired laser oscillator tuning frequencies associated preset values of the tuning signals, as well as proportionality constant belonging to each preset value, which constant is used for determining the correction value, are stored in the memory. Adapting the preset value of the tuning signals with the aid of proportionality constants, which constants may be different for each preset value, provides adapted preset values in a simple manner. The proportionality constants may then be selected such that over the entire tuning range boundaries between ranges denoting different oscillation modes are not transgressed. Hereinafter which values are to be selected for the various constants is described.

The frequency correction caused by the control loop may be described in linear approximation as follows:

$$\Delta f = \left(\frac{\delta f}{\delta I_1}\right)_j \cdot \Delta I_1^m(j) + \left(\frac{\delta f}{\delta I_2}\right)_j \cdot \Delta I_2^m(j) + \ldots + \left(\frac{\delta f}{\delta I_N}\right)_j \cdot \Delta I_N^m(j), \quad \text{Eq. (4)}$$

where $(\delta f/\delta I_x)_j$ is the local derivative of the frequency of the laser-generated light signal to the current $I_x$ for a given preset value j of the signals $I_1$ to $I_N$.

A similar frequency change may also be realized by adapting the preset value while maintaining the relation according to Eq. (2). Then there may be written:

$$\Delta f = \left(\frac{df}{dI_1}\right)_j \cdot \Delta I_1(i), \quad \text{Eq. (5)}$$

Where i is one of the optional preset values of the signals $I_1$ to $I_N$. Equalization of Eq. (4) and Eq. (5) produces for the adaptation of the preset value $\Delta I_1$:

$$\Delta I_1 = \frac{\left(\frac{\delta f}{\delta I_1}\right)_j}{\left(\frac{df}{dI_1}\right)_i} \cdot (\Delta I_1^m)_j + \frac{\left(\frac{\delta f}{\delta I_2}\right)_j}{\left(\frac{df}{dI_1}\right)_i} \cdot (\Delta I_2^m)_j + \ldots + \frac{\left(\frac{\delta f}{\delta I_N}\right)_j}{\left(\frac{df}{dI_1}\right)_i} \cdot (\Delta I_N^m)_j = \quad \text{Eq. (6)}$$

$$K_1(i,j) \cdot \Delta I_1^m(j) + K_2(i,j) \cdot \Delta I_2^m(j) + \ldots + K_N(i,j) \cdot \Delta I_N^m(j),$$

Where, the following holds for $df/dI_1$:

$$\left(\frac{df}{dI_1}\right)_i = \left(\frac{\delta f}{\delta I_1}\right)_i + \left(\frac{\delta f}{\delta I_2}\right)_i \cdot \left(\frac{dg_2}{dI_1}\right)_i + \ldots + \left(\frac{\delta f}{\delta I_N}\right)_i \cdot \left(\frac{dg_N}{dI_1}\right)_i \quad \text{Eq. (7)}$$

The correction values of the other tuning signals $I_2$ to $I_N$, may simply be derived as follows:

$$\Delta I_k(i) = \left(\frac{dg_k}{dI_1}\right)_i \cdot \Delta I_1(i) \quad \text{Eq. (8)}$$

BRIEF DESCRIPTION OF THE DRAWINGS

The invention will now be further explained with reference to the following drawings in which like elements are denoted by the reference characters.

DETAILED DESCRIPTION OF THE PREFERRED EMBODIMENTS

Figure 1:
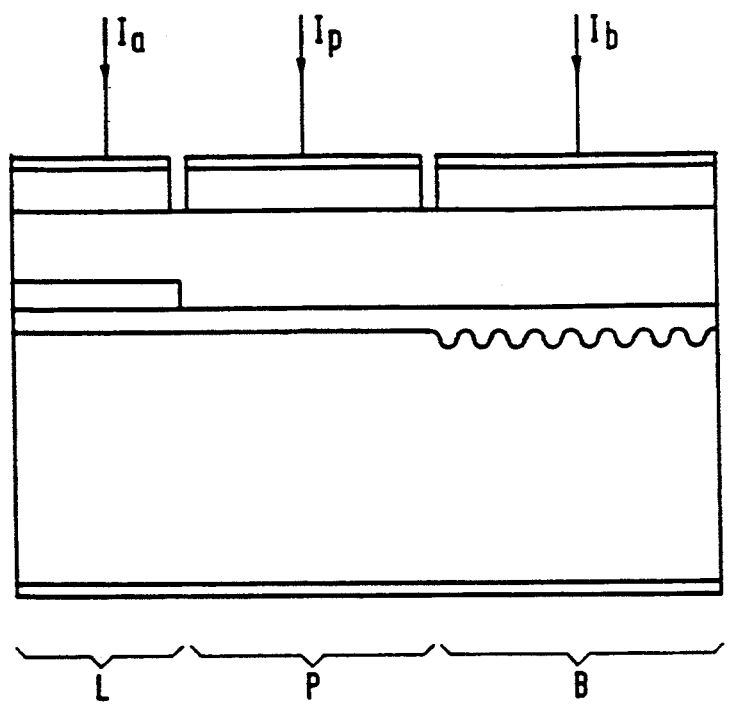
FIG. 1 shows a cross-section of a Distributed Bragg laser.

In a tunable laser oscillator, a Distributed Bragg Reflector (DBR) laser, as shown in FIG. 1, may be used, for example. Such a laser comprises an amplifier section L, a transmission line section P and a (reflecting) Bragg section B.

A current $I_a$ is applied to the amplifier section L, which current is to exceed a certain threshold to make optical amplification possible. Currents $I_p$ and $I_b$ are applied to the transmission line section P and the Bragg section B, respectively. The current $I_p$ in the transmission line section determines the breaking index thereof and, thus, the phase rotation of the transmission line section. The current $I_b$ in the Bragg section influences the breaking index thereof and, thus, determines the phase of the light reflected by the Bragg section.

For laser oscillation with a desired frequency, the sum of the phase rotations in the Bragg section and the transmission line section P is to be equal to $K \cdot 2 \cdot \pi (K \epsilon N)$, and the phase rotation in the Bragg section B is to be nearest to $\pi/2$, an auxiliary condition. In the event of large deviations from the auxiliary condition, frequency jumps may occur during the laser tuning. These frequency jumps are the result of the sudden change from K to a value for which the phase rotation in the Bragg section B is nearer to $\pi/2$.

By giving suitably selected values to the currents $I_b$ and $I_p$, the two conditions may be satisfied so that the undesired frequency jumps do not occur. However, the desired relation between $I_b$ and $I_p$ is generally not proportional, so that when there is a proportional relation between $I_b$ and $I_p$, as is the case in a laser oscillator according to the state of the art, there may, nevertheless, be undesired frequency jumps. It is conceivable for the frequency of such a laser to be adjusted by means of temperature in addition to currents. For this purpose, a temperature control circuit is present which is controlled by a temperature control signal. Such a temperature control signal is to be considered a frequency control signal (i.e., a tuning signal).

Figure 2:
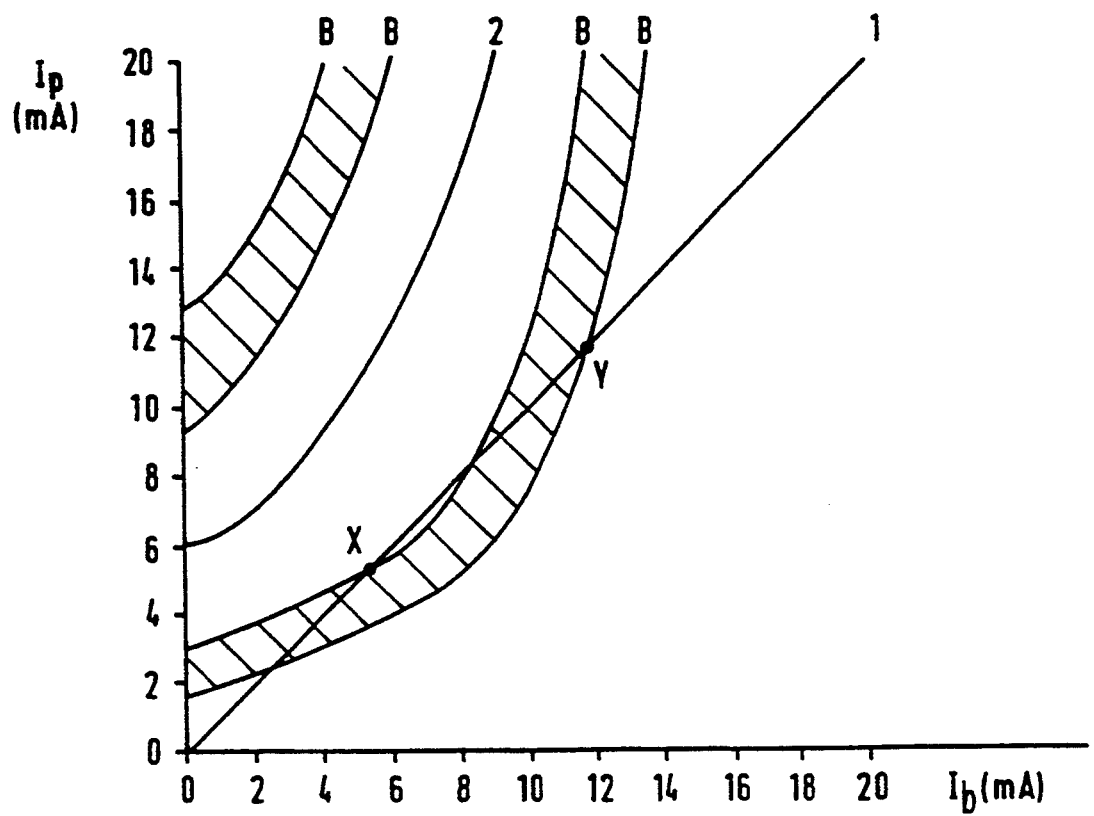
FIG. 2 shows a graph in which the boundaries of different oscillation modes of a laser are plotted against two tuning signals and in which a tuning curve according to the state of the art and a tuning curve according to the invention are shown.

In FIG. 2, a characteristic of a DBR laser is represented. The boundaries of different oscillation modes are plotted against the tuning signals of the two control inputs (i.e., current $I_p$ and $I_b$). These boundaries are denoted by the letter B. In the hatched area, the oscillation mode is uncertain, but is equal to the oscillation mode when the boundary B is transgressed. FIG. 2 also shows a tuning curve which represents the relation between the two tuning signals generated by a state-of-the-art laser oscillator (see curve 1). It is clearly noticeable that during the tuning operation this tuning curve transgresses the boundary between different oscillation modes several times (see point X and point Y) so that a frequency jump will occur. By making, in accordance with the inventive idea, the relation between tile two tuning signals disproportional, it is possible to avoid the boundary between different oscillation modes being transgressed. Such a disproportional relation is shown in curve 2.

Figure 3:
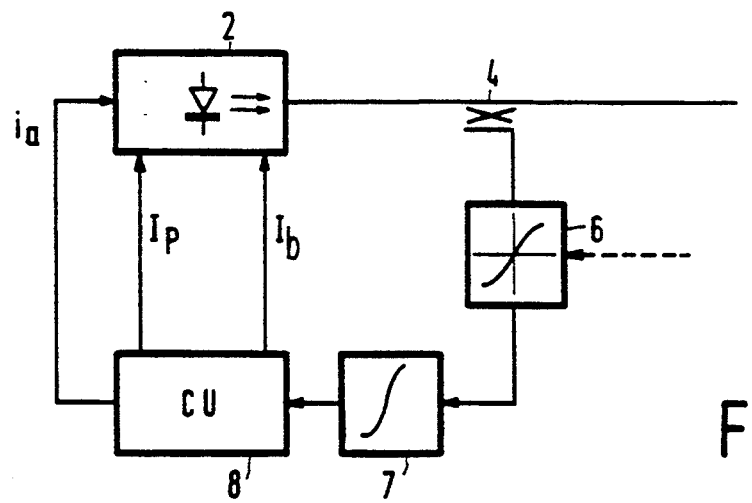
FIG. 3 shows a block diagram of a tunable laser oscillator according to the invention.

In a laser oscillator as shown in FIG. 3, two outputs of a control unit 8, carrying tuning (i.e., frequency) signals, i.e., the two currents $I_p$ and $I_b$, are connected to two control inputs of a laser 2. In addition, another output of the control unit 8, carrying output signal $I_a$ (i.e., current $I_a$) is connected to a power control input of the laser 2. The output of the laser 2 is connected to the output of the laser oscillator by way of the coupling element 4. A second output of the coupling element 4 is connected to an input of a frequency discriminator 6. In specific embodiments of the frequency discriminator 6, a further light signal is fed to a second input of the frequency discriminator 6. The output of the frequency discriminator 6 is connected to the input of an integrator 7. The output of the integrator 7 is connected to an input of the control unit 8. The frequency discriminator 6 and the integrator 7 together form a frequency comparing unit.

To enable the laser 2 to operate, the control unit 8 applies a signal, in this case current $I_a$, to the amplifier section of the laser. The power produced by the laser can be set with the aid of the current $I_a$.

Currents $I_p$ and $I_b$ are applied to the transmission line section and the Bragg section, respectively. These currents are also supplied by the control unit 8.

The frequency of a light signal generated by a laser strongly depends on the temperature of the laser. To avoid the frequency of the laser-generated light signal strongly deviating from a desired value, as a result of temperature fluctuations, the laser is accommodated on a Peltier cooling element whose temperature may be accurately maintained at a constant level.

The light signal available at the output of the laser 2 of FIG. 3 is led to a destination via the coupling element 4. This distinction may be a glass fibre or a photodiode in an optical heterodyne receiver. A small portion of the light signal generated by the laser 2 is led to the frequency discriminator 6 via the coupling element 4. This frequency discriminator 6 determines the frequency difference between the frequency of the light signal generated by the laser 2 and a reference frequency. The output signal of the frequency discriminator, a frequency difference signal, which is a measure of the frequency difference, is integrated in the integrator 7 and then fed to the control unit 8. The control unit 8 then generates tuning signals $I_p$ and $I_b$ so that the frequency difference and, hence, the input signal of the integrator becomes zero while the desired relation between $I_b$ and $I_p$, in accordance with the tuning curve, is maintained.

The control unit 8 may adapt the tuning signals in various ways. A first way is to apply the output signal of the integrator 7 to one of the control inputs of the laser 2, while the other tuning signal is derived from the first tuning signal with the aid of an auxiliary circuit.

Figure 4:
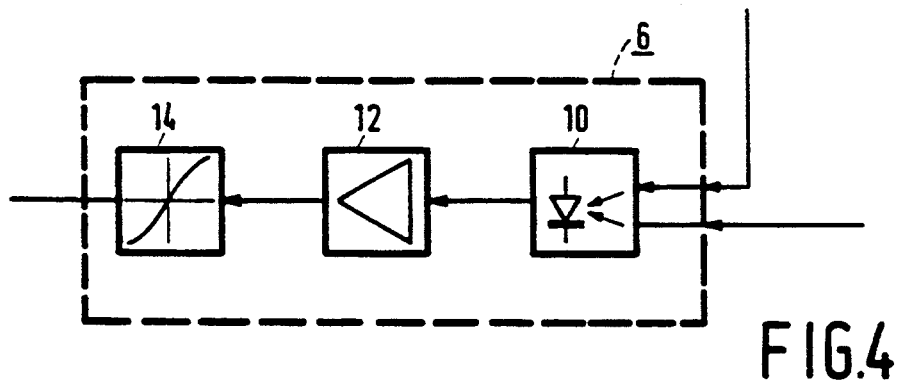
FIG. 4 shows a block diagram of an embodiment of a frequency discriminator to be used in the tunable laser oscillator as shown in FIG. 3.

FIG. 4 shows an embodiment of the frequency discriminator 6. The light signal coming from the coupling element 4 of FIG. 1, together with a further optical signal, is applied to a photodiode 10. The further optical signal may be, for example, a light signal received from a transmitter through a glass fibre. As a result of interference of the two light signals, an electric signal having a frequency equal to the frequency difference between the two light signals will be present in the output signal of the photodiode 10. The output signal of the photodiode is applied to an amplifier which amplifies the electric signal to a desired value. The output signal of the amplifier is applied to the input of a frequency discriminator 14 which determines on the basis of its input signal a frequency difference signal which is a measure of the frequency difference between the two light signals.

The frequency discriminator 6 will often form part of an optical heterodyne receiver by which information modulated on the further optical signal is received and demodulated. If information about the frequency of the further optical signal is modulated on thereon (for example, a channel number), this information may be used for verifying a correct tuning of the laser oscillator. If the further optical signal comprises a plurality of optical carriers which have different frequencies, the control unit may compare the channel number set by a user with the channel number of the currently received carrier, and, when there is a difference between the two, the control unit may start looking for the desired channel with the aid of a look-up procedure.

The frequency discriminator 6 of FIG. 3 may also comprise, as does the frequency discriminator in U.S. Pat. No. 4,914,666, a Fabry-Perot resonator.

Figure 5:
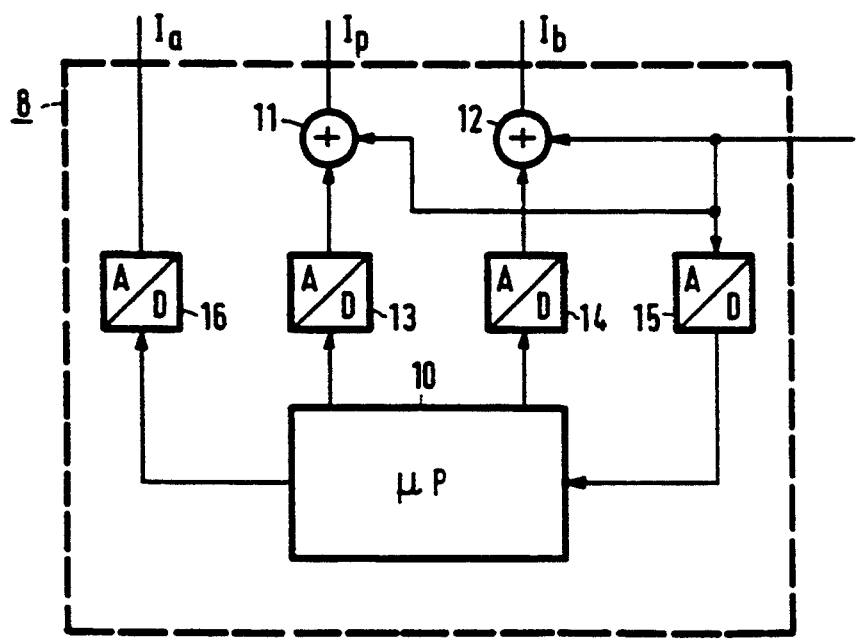
FIG. 5 shows a block diagram of a control unit to be used in the tunable laser oscillator as shown in FIG. 3.

In the control unit 8, as shown in FIG. 5, the frequency difference signal is applied to an input of an analog-to-digital converter 15, which comprises a combining unit, in this case which includes an adder 11 and an adder 12. The output of the analog-to-digital converter 15 is connected to an input of a microprocessor 10.

A first output of the microprocessor 10 is connected to an input of a digital-to-analog converter 16. The output of the digital-to-analog converter 16 forms an output of the control unit 8, the one which carries output signal $I_a$ (i.e., current $I_a$).

A second output of the microprocessor 10 is connected to an input of a digital-to-analog converter 13. The output of the digital-to-analog converter 13 is connected to a further input of the adder 11. The output of the adder 11 forms another output of the control unit 8, the one which carries output tuning signal $I_p$ (i.e., current $I_p$).

A third output of the microprocessor 10 is connected to an input of a digital-to-analog converter 14. The output of the digital-to-analog converter 14 is connected to a further input of the adder 12. The output of the adder 12 forms still another output of the control unit 8, the one which carries output tuning signal $I_b$ (i.e., current $I_b$).

In the control unit 8, the tuning signals $I_p$ and $I_b$ are obtained by adding the output signal of the integrator 8 to each preset value of the tuning signals. Each preset value is coarsely tuned to a desired frequency, whereas the output signal adapts the frequency of the laser so that the frequency difference signal becomes zero. The combination of the adders 11 and 12, the laser 2 (FIG. 3), the frequency discriminator 6 (FIG. 3) and the integrator 7 (FIG. 3) forms an automatic frequency control loop. The preset values of the tuning signals are stored in the memory of the microprocessor 10. A certain number of preset values are often stored in the memory of the microprocessor 10 to enable the laser oscillator to be tuned to different frequencies.

In many cases, the frequency difference which can be determined by the frequency discriminator has a maximum value. This means that the laser may only be tuned correctly on the basis of the reference frequency when the frequency difference is smaller than this maximum value. For example, as a result of the ageing process of the laser, it is possible for the initial frequency difference to slowly increase when the laser oscillator is tuned to a certain frequency. To avoid having this initial frequency difference exceed the maximum frequency difference at a specific instant, each preset value is regularly adjusted on the basis of the output signal of the integrator 7 so that the initial frequency difference remains small when the laser oscillator is tuned. This adjustment may be effected in various ways which will be explained hereinafter.

Figure 6:
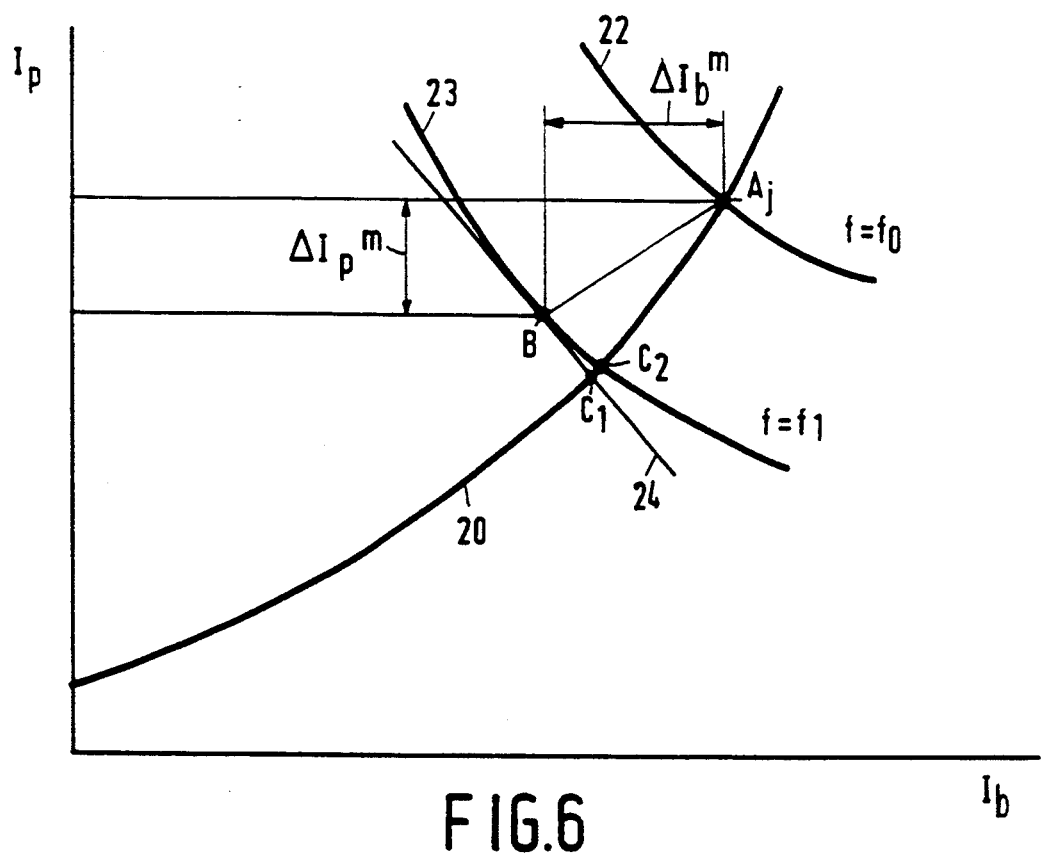
FIG. 6 shows a tuning curve of a DBR Laser in which the adaptation of a preset value according to a first embodiment of the invention is shown.

FIG. 6 shows a desired relation 20 between tuning (i.e., current) signals $I_p$ and $I_b$. FIG. 6 additionally shows some curves (22, 23) at which the frequency of the light signal generated by a laser remains constant. It is now assumed that a set of the preset values for the tuning signals stored in the memory of the microprocessor 10 is represented by point A; A frequency $f_0$ belongs to this set of preset values. If the reference frequency is equal to $f_1$, the aforementioned frequency control loop will cause the frequency of the laser to become equal to $f_1$. This is effected by adding the values $\Delta I_p$ and $\Delta I_b$ (i.e., correction values) to the preset values for the signals $I_p$ and $I_b$, respectively. FIG. 6 shows that the tuning signals adopt the preset values indicated by point B.

If an analytical expression is available for both the tuning curve 20 and the curve of constant frequency 23, a correct set of preset values for the tuning signals $I_p$ and $I_b$ may be determined by determining the intersection $C_2$ of the curves 20 and 23. Generally, this is to be effected with the aid of numerical methods because usually no analytical expression can be found for the intersection. Such numerical methods are described, for example, in the book entitled "Einfuhrung in die Numerische Mathematik I" by Josef Stoer, Springer Verlag, ISBN 0-387-05750-1, chapter 5.

The calculation of the correction values may be simplified if the curve 23 is approximated by a curve having a slope equal to the local derivative $(\delta I_p/\delta I_b)_A$ of the curve 22 at the point Aj. This derivative may be determined, for example, by an initial calibration measurement of the laser. The set of preset values of the tuning signals found in this manner are denoted $C_1$ in FIG. 6. FIG. 6 likewise shows that after correction of the preset values, there is still a frequency difference, but it is much smaller than the original frequency difference. For that matter, $C_1$ is much nearer to the correct preset values of $C_2$ then point Aj. With the correction values $\Delta I_p$ and $\Delta I_b$ measured after the previous correction, similar corrections may be constantly made so that the preset values of $C_1$ may randomly form a good approximation of the correct preset values of $C_2$.

For further simplification of the correction of the preset values, the curve 20 may be approximated by means of a plurality of preset value points and their derivatives $(\delta I_p/\delta I_b)$. The correction of the preset values is then made in accordance with the previously derived relations of Eq. (5) and Eq. (6) in the following manner:

$$I_p = I_p + \Delta I_p = I_p + K_1(j,j) \cdot \Delta I_b{}^m + K_2(j,j) \cdot \Delta I_p{}^m$$

$$I_b = I_b + \left(\frac{dI_b}{dI_p}\right) \cdot \Delta I_p \qquad \text{Eq. (9)}$$

Figure 7:
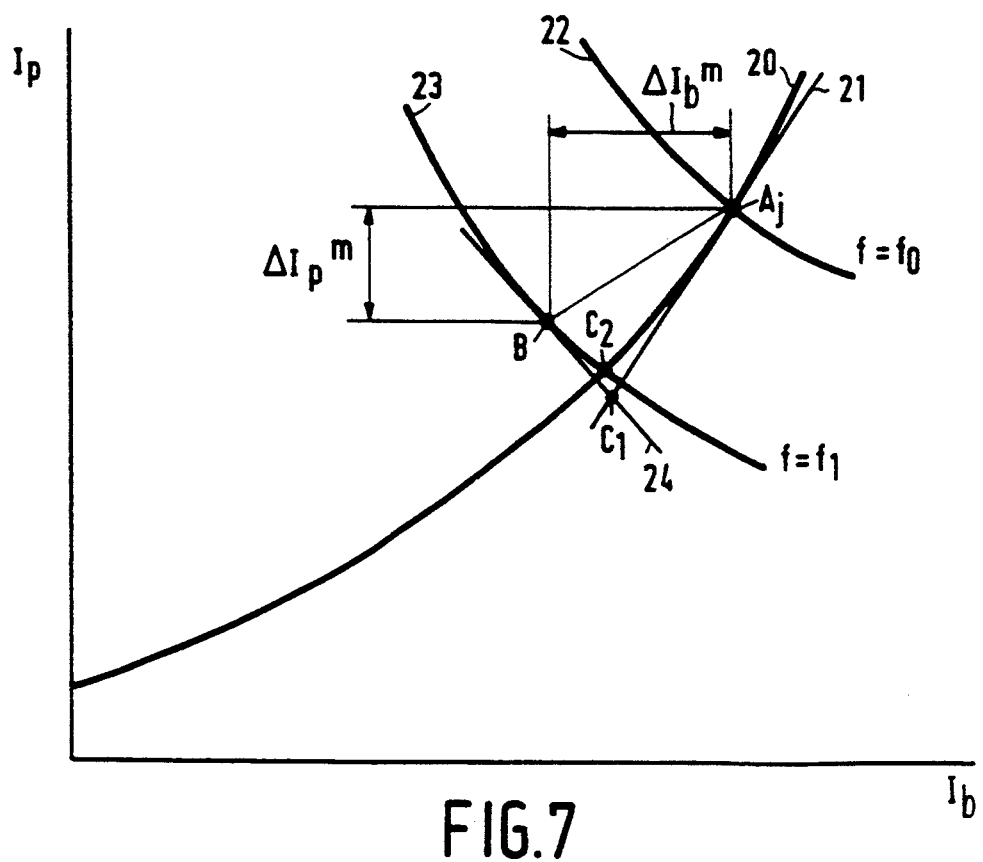
FIG. 7 shows a tuning curve of a DBR laser in which the adaptation of the preset value according to a second embodiment of the invention is shown.

FIG. 7 gives a graphic representation of this way of correction. The new preset values of $C_1$ are now determined by the intersection of the curves 21 and 24. In this method, the preset value 5 are always situated on curve 24. Although this curve deviates slightly from curve 21, this deviation does not appear to cause any problems in practice.

Alternatively, it is possible to correct the preset values stored in the memory of the microprocessor 10 on the basis of the measured correction values $\Delta I_p$ and $\Delta I_b$. For this correction, the following holds according to Eq. (5) and Eq. (6):

$$I_p(i) = I_p(i) + \Delta I_p(i) = I_p(i) + K_1(i,j) \cdot \Delta I_p{}^m(j) + K_2(i,j) \cdot \Delta I_p{}^m(j)$$

$$I_b(i) = I_b(i) + \left(\frac{bI_b}{dI_p}\right)_i \cdot \Delta I_p(i) \qquad \text{Eq. (10)}$$

The coefficients $K(i,j)$ may be experimentally determined as follows. The laser is turned along the tuning curve to the frequencies $f_i$. For each setting, the derivatives $\delta f_i/\delta I_b$ and $\delta f_i/\delta I_p$ are determined. In addition, the derivative $dI_p/dI_b$ of the tuning curve is determined for each frequency $f_i$. The constants $K(i,j)$ may then be determined from this data with the aid of Eq. (5) and Eq. (6).

Figure 8:
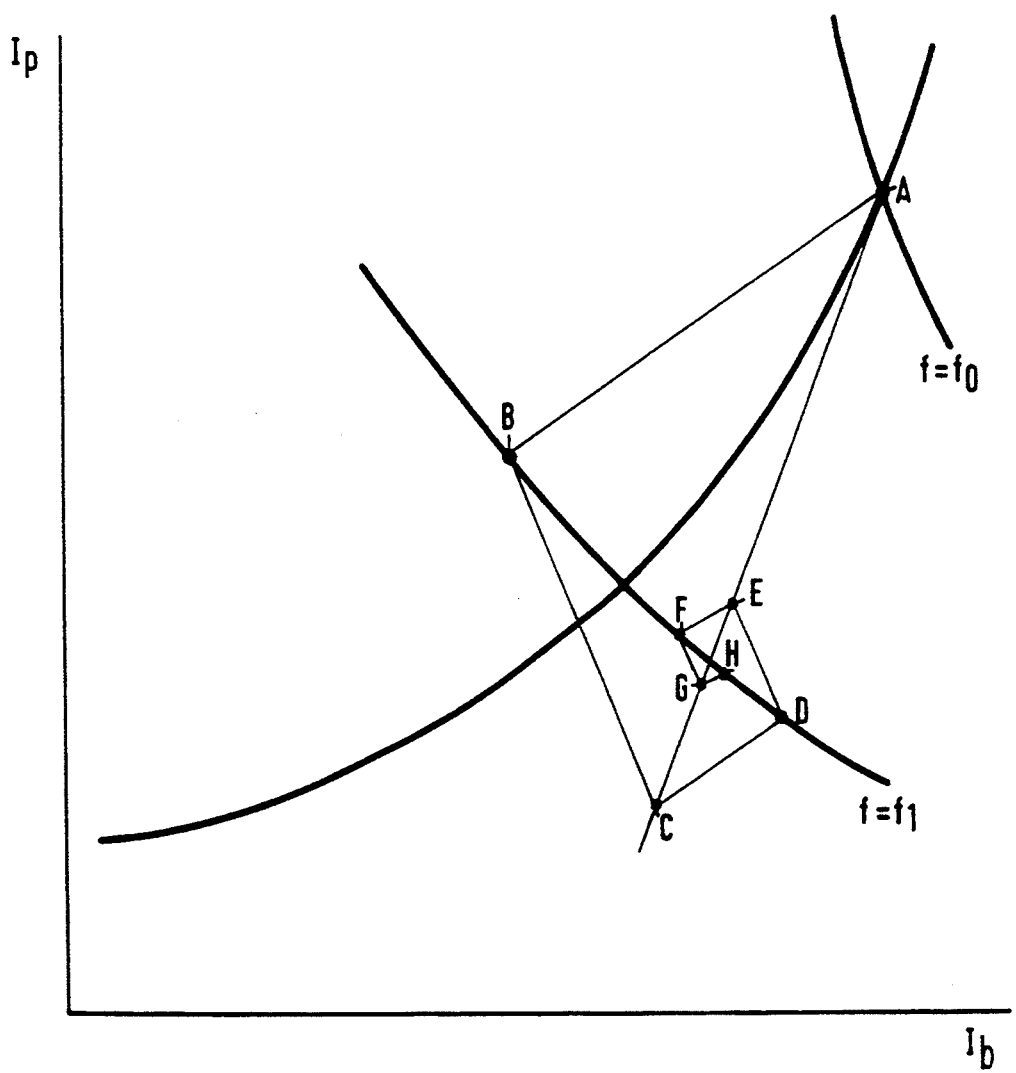
FIG. 8 shows the tuning curve as shown in FIG. 7 in which the correction of the preset value is illustrated if the adaptation method according to a second embodiment of the invention is recurrently used.

FIG. 8 gives a graphic representation of the recurrent correction of the preset values. This figure shows that with the first correction the preset values shift from point A to point C; with the second correction, the preset values shift from point C to point E with the third correction, the preset values shift from point E to point G; and so on. This markedly shows that when the preset values are recurrently adjusted, the preset values eventually obtains a correct set of preset values for which the frequency difference becomes zero.

We claim:

1. A laser oscillator, comprising:
   a laser for producing a laser output signal, said laser having a first control input and at least one additional control input; and
   control means for applying a first tuning signal to said first control input and at least one additional tuning signal to said at least one additional control input for tuning said laser output signal to a desired frequency, said first tuning signal and said at least one additional tuning signal having a disproportional relationship.

2. The laser oscillator as claimed in claim 1, further comprising frequency comparing means for supplying said control means with a frequency difference signal which is a measure of a difference between the frequency of the laser output signal and a reference frequency, wherein said control means comprises adapting means for adapting at least one of said first tuning signal and said at least one additional tuning signal to reduce the frequency difference.

3. The laser oscillator as claimed in claim 2, further comprising a memory for storing at least a preset value for at least one of said first tuning signal and said at least one additional tuning signal, wherein said adapting means comprises a combining means for combining the frequency difference signal with the present value to derive the tuning signal for which the preset value is stored in said memory.

4. The laser oscillator as claimed in claim 3, wherein said adapting means further comprises correction means for correcting the present value in response to the frequency difference signal.

5. The laser oscillator as claimed in claim 4, wherein said correction means comprises adding means for adding a correction value which is proportional to the frequency difference signal to the preset value.

6. The laser oscillator as claimed in claim 5, wherein said memory further comprises for each of a finite number of desired laser oscillator tuning frequencies an associated value for the preset value and a proportionality constant belonging to that associated value, which proportionality constant is used for determining the correction value.

7. The laser oscillator as claimed in claim 6, wherein said correction means further comprises means for correcting each associated value for the preset value on the basis of a currently desired tuning frequency.

8. The laser oscillator as claimed in claim 2, wherein said frequency comparing means is adapted to receive a further optical signal whose frequency is the reference frequency.

9. The laser oscillator as claimed in claim 8, further comprising means for receiving from a modulation of the further optical signal information about the frequency of the further optical signal.

10. The laser oscillator as claimed in claim 3, wherein said frequency comparing means is adapted to receive a further optical signal whose frequency is the reference frequency.

11. The laser oscillator as claimed in claim 4, wherein said frequency comparing means is adapted to receive a further optical signal whose frequency is the reference frequency.

12. The laser oscillator as claimed in claim 4 wherein said memory further comprises for each of a finite number of desired laser oscillator tuning frequencies an associated value for the preset value and a proportionality constant belonging to that associated value which proportionality constant is used for determining a correction value for use in correcting the preset value.

13. The laser oscillator as claimed in claim 12, wherein said correction means further comprises means for correcting each associated value for the preset value on the basis of a currently desired tuning frequency.

14. The laser oscillator as claimed in claim 4 wherein said correction means further comprises means for correcting associated values of the preset value for different tuning frequencies on the basis of a currently desired tuning frequency.

15. The laser oscillator as claimed in claim 14, wherein said memory stores the associated values of the preset value.

* * * * *